US012250869B2

(12) United States Patent
Dou et al.

(10) Patent No.: US 12,250,869 B2
(45) Date of Patent: Mar. 11, 2025

(54) MECHANICALLY ROBUST AND SELF-HEALABLE PEROVSKITE SOLAR CELLS

(71) Applicant: Purdue Research Foundation, West Lafayette, IN (US)

(72) Inventors: Letian Dou, West Lafayette, IN (US); Blake Peter Finkenauer, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 18/527,201

(22) Filed: Dec. 1, 2023

(65) Prior Publication Data

US 2024/0114764 A1 Apr. 4, 2024

Related U.S. Application Data

(62) Division of application No. 17/720,348, filed on Apr. 14, 2022, now Pat. No. 11,877,504.

(60) Provisional application No. 63/186,077, filed on May 8, 2021, provisional application No. 63/174,635, filed on Apr. 14, 2021.

(51) Int. Cl.
| H10K 85/10 | (2023.01) |
| H10K 85/40 | (2023.01) |
| H10K 30/10 | (2023.01) |
| H10K 102/00 | (2023.01) |
| H10K 102/10 | (2023.01) |

(52) U.S. Cl.
CPC ............. *H10K 85/10* (2023.02); *H10K 85/40* (2023.02); *H10K 30/10* (2023.02); *H10K 2102/101* (2023.02); *H10K 2102/351* (2023.02)

(58) Field of Classification Search
CPC ........ H10K 85/10; H10K 85/40; H10K 30/10; H10K 2102/101; H10K 2102/351; H10K 30/50; H10K 85/151; H10K 85/50; H10K 30/30; H10K 85/141; Y02E 10/549
See application file for complete search history.

(56) References Cited

U.S. PATENT DOCUMENTS

| 2016/0079552 A1 | 3/2016 | Su et al. |
| 2021/0002505 A1 | 1/2021 | Yu et al. |

OTHER PUBLICATIONS

Menglan Xie "Fully Solution-Processed Semi-Transparent Perovskite Solar Cells With Ink-Jet Printed Silver Nanowires Top Electrode" Sol. RRL 2018, 2, 1700184 (Year: 2018).*
Yu Yanagisawa "Mechanically robust, readily repairable polymers via tailored noncovalent cross-linking" Science 359, 72-76 (2018) (Year: 2018).*

(Continued)

*Primary Examiner* — Michael Y Sun
(74) *Attorney, Agent, or Firm* — Purdue Research Foundation

(57) ABSTRACT

A perovskite-polymer composite comprising a perovskite and a polymer, wherein the polymer has a structural unit comprising a thiourea (—HN(C═S)NH—) fragment and a (—R$^1$—O—R$^2$—) fragment, wherein R$^1$ and R$^2$ are each independently a C$_1$-C$_6$ alkyl or a cycloalkyl linker; a mechanically robust and self-healable solar cell comprising same; and a method of making same.

12 Claims, 7 Drawing Sheets

(56) References Cited

OTHER PUBLICATIONS

Alexander D. Taylor "A general approach to high-efficiency perovskite solar cells by any antisolvent" Nature Communications | (2021) 12:1878 (Year: 2021).*
Zijun Wang "Enhanced efficiency and stability of p-i-n perovskite solar cells using PMMA doped PTAA as hole transport layers" Synthetic Metals 265 (2020) 116428 (Year: 2020).*
Fangchao Li "A Universal Strategy to Utilize Polymeric Semiconductors for Perovskite Solar Cells with Enhanced Efficiency and Longevity" Adv. Funct. Mater. 2018, 28, 1706377 (Year: 2018).*
Liu, G. et.al., Regulated Crystallization of Efficient and Stable Tin-Based Perovskite Solar Cells via a Self-Sealing Polymer, ACS Appl. Mater. Interfaces ,2020,12,14049-14056.
Zhao, Y. et.al., Polymer scaffold for self-healing perovskite solar cells, Nature Communications 7,10228, Jan. 6, 2016.
Oh, J. Y. et al., Stretchable self-healable semiconducting polymer film for active-matrix strain-sensing array, Sci. Adv. 2019; 5.
Yanagisawa, Yu et al., "Mechanically robust, readily repairable polymers via tailored noncovalent cross-linking" Science 359, 72-76 (2018), (Year: 2018).

\* cited by examiner

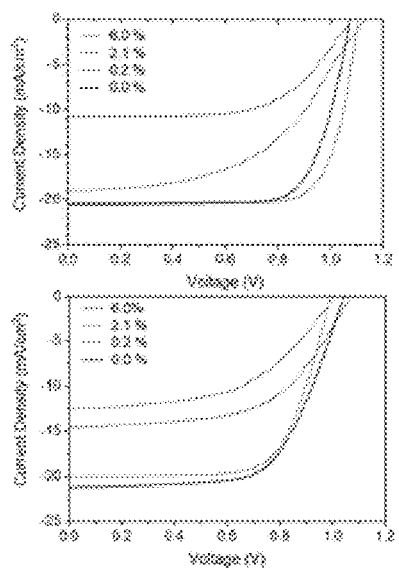
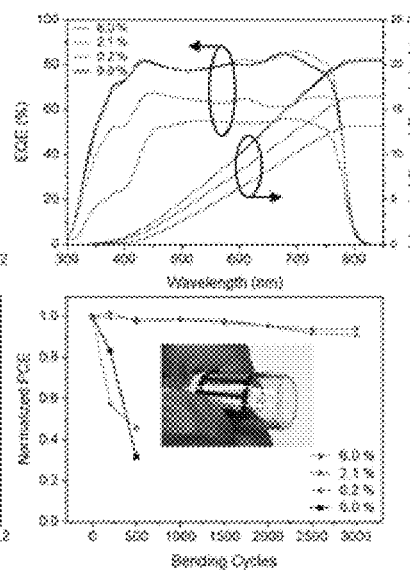
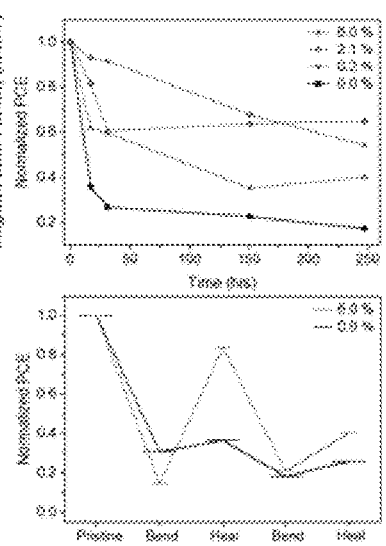
FIG. 4A  FIG. 4B  FIG. 4C
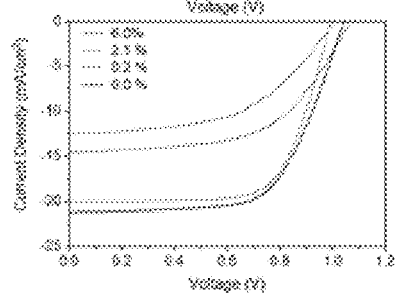
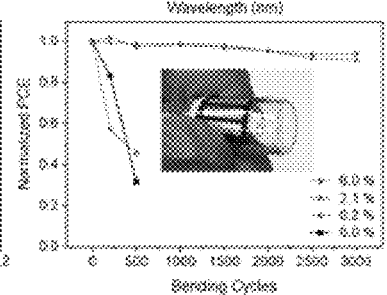
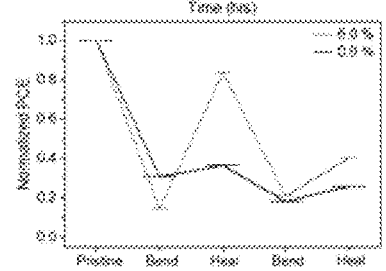
FIG. 4D  FIG. 4E  FIG. 4F

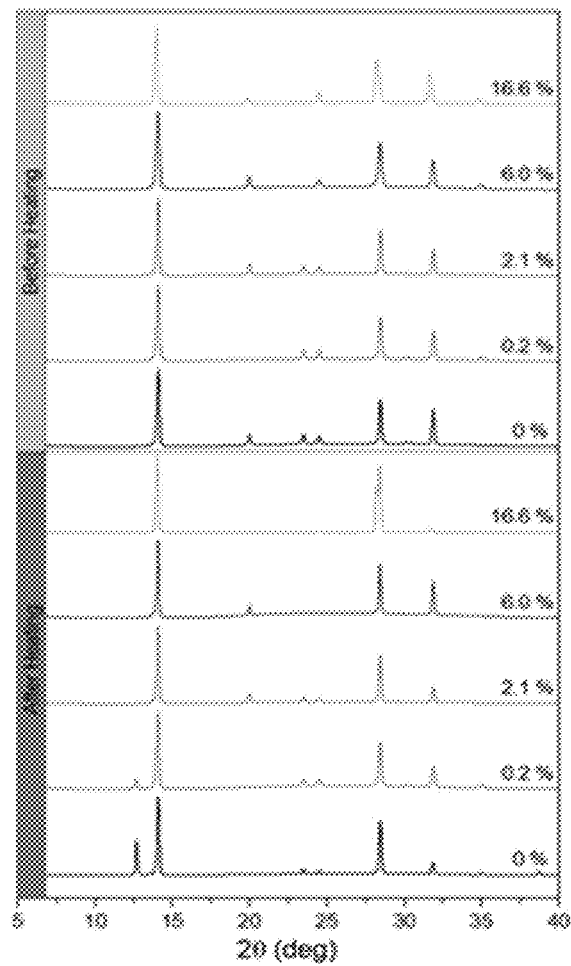
FIG. 7A
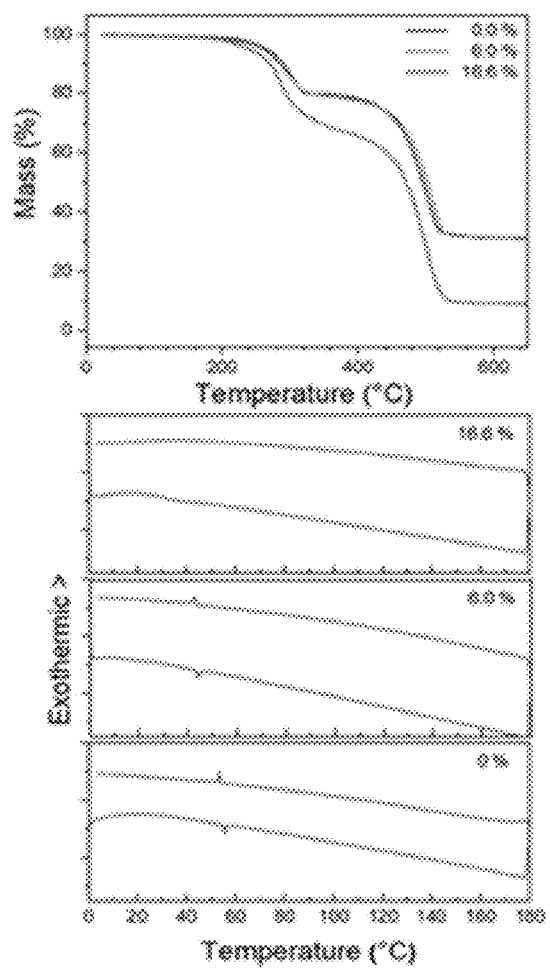
FIG. 7B
FIG. 7C

MECHANICALLY ROBUST AND SELF-HEALABLE PEROVSKITE SOLAR CELLS

CROSS-REFERENCE TO RELATED APPLICATIONS

This application is a divisional application of U.S. patent application Ser. No. 17/720,348, which was filed Apr. 14, 2022, and claims priority to U.S. Provisional Patent application No. 63/174,635, which was filed Apr. 14, 2021, and U.S. Provisional Patent application No. 63/186,077, which was filed May 8, 2021, the contents each of which are incorporated herein by reference in their entireties.

GOVERNMENT RIGHTS

This invention was made with government support under contract number N00014-19-1-2296 awarded by the Office of Naval Research. The government has certain rights in the invention.

TECHNICAL FIELD

The present disclosure relates to novel mechanically robust and self-healable perovskite solar cells, and the method of making and using the novel perovskite solar cells.

BACKGROUND

This section introduces aspects that may help facilitate a better understanding of the disclosure. Accordingly, these statements are to be read in this light and are not to be understood as admissions about what is or is not prior art.

Self-healing is a fascinating property widely observed in biological species and organic materials, such as rubber, but has not been fully utilized in electronics. Developing new self-healing electronic materials and understanding their intrinsic self-healing mechanism is key to the design of advanced functional devices. Conventional organic self-healing materials utilize both polymer chain mobility and intermolecular forces to repair mechanical damage such as lacerations and tears. These intermolecular forces include hydrogen bonds, dynamic covalent bonds, metal-ligand coordination bonds, and ion-dipole interactions. The fundamental differences between semiconducting and self-healing materials have made their combination difficult. High-performance semiconducting materials are usually ordered crystalline or semi-crystalline materials, while self-healing materials are amorphous and fluidic. Only recently the first self-healing and semiconducting composite material was realized by blending a conjugated polymer with an amorphous self-healing polymer. However, the resulting field effect transistor device only achieved mobility values of ~0.1 cm²/Vs, which is orders of magnitude lower than corresponding non-self-healing devices.

Therefore, mechanically robust and self-healable perovskite solar cells with higher performance are still needed.

SUMMARY

The present disclosure relates to novel mechanically robust and self-healable perovskite solar cells, and the method of making and using the novel perovskite solar cells.

In one embodiment, provided is a perovskite-polymer composite comprising a perovskite and a polymer, wherein the polymer has a structural unit comprising a thiourea (—HN(C=S)NH—) fragment and a (—$R^1$—O—$R^2$—) fragment, wherein $R^1$ and $R^2$ are each independently a $C_1$-$C_6$ alkyl or a cycloalkyl linker. The structural unit can further comprises a (—O—Si(CH$_3$)$_2$—O—) fragment and the perovskite has a formula of $ABX_3$, where A is $Cs^+$, $CH_3NH_3^+$ (MA), $NH_2(CH)NH_2^+$ (FA), or any combination thereof; B is $Ge^{2+}$, $Sn^{2+}$, $Pb^{2+}$, or any combination thereof; X is $Cl^-$, $Br^-$, $I^-$ or any combination thereof.

In one embodiment, provided is the perovskite-polymer composite comprising the perovskite and the polymer, wherein the polymer has a formula I:

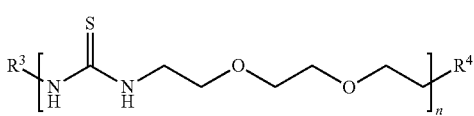

wherein $R^1$ and $R^2$ are —CH$_2$—CH$_2$—, $R^3$ and $R^4$ are each independently —NH$_2$ or

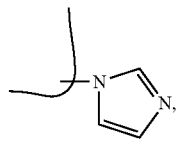

wherein —NH$_2$ and/or

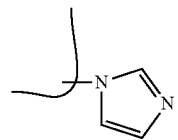

can be in protonated form, and n is 10-300.

The polymer has a weight percentage of about 2-25% of the total weight of the perovskite and the polymer. Thickness of perovskite-polymer composite film is of 10 nm-10 μm or 1 nm-1.0 μm.

In one embodiment, provided is a solar cell comprising a transparent conducting layer, a hole transporting layer, a perovskite layer, an electron transporting layer, and a counter electrode layer, wherein the perovskite layer comprises the film of the perovskite-polymer composite.

The transparent conducting layer serves as the electrical contact on the side of the device stack, which allows light to enter the solar cell and is selected from the group comprising of indium doped tin oxide (ITO), fluorine doped tin oxide (FTO), ZnO—Ga$_2$O$_3$, ZnO—Al$_2$O$_3$, tin oxide, antimony doped tin oxide (ATO), SrGeO$_3$ zinc oxide, or any combination thereof.

The electron transporting layer is used to facilitate the selective extraction of electrons out of the absorbing perovskite layer and is selected from the group comprising of [6,6]-phenyl-C$_{61}$-butyric acid methyl ester (PC$_{61}$BM), 1,4,5,8,9,11-hexaazatriphenylene-hexacarbonitrile (HAT-CN), (C$_{60}$-I$_h$)[5,6]fullerene (C$_{60}$), (C$_{70}$-D5h)[5,6]fullerene (C$_{70}$), [6,6]-Phenyl C$_{71}$ butyric acid methyl ester (PC$_{71}$BM), 2,9-dimethyl-4,7-diphenyl-1,10-phenanthroline (BCP), 1,3,5-tri(phenyl-2-benzimi-dazolyl)-benzene (TPBI), polyethyleneimine ethoxylated (PEIE), poly [(9,9-bis(3'-(N,N-dimethylamino)propyl)-2,7-fluorene)-alt-2,7-(9,9-dioctylfluorene)] (PFN) or metal oxide, wherein the metal oxide is an oxide of a metal selected from the group consisting of Ti, Sn, Cs, Fe, Zn, W, Nb, SrTi, Si, Ti, Al, Cr, Sn, Mg, Mn, Zr, Ni, and Cu.

The hole transporting layer facilitate the selective extraction of holes from the absorbing perovskite layer and is selected from the group comprising of triphenylamine, carbazole, N,N,(diphenyl)-N',N'di-(alkylphenyl)-4,4'-biphenyl-diamine (pTPDs), diphenylhydrazone, poly [N,N'-bis(4-butylphenyl)-N,N'-bis(phenyl)benzidine] (polyTPD), polyTPD substituted by electron donor groups and/or acceptor groups, poly(9,9-dioctylfluorene-alt-N-(4-butylphenyl)-diphenylamine (TFB), 2,2',7,7'-tetrakis-N,N-di-p-methoxyphenylamine-9,9'-spirobifluorene) (spiro-OMeTAD), N,N,N',N'-tetraphenylbenzidine (TPD), poly[bis(4-phenyl)(2,4,6-trimethylphenyl)amine (PTAA), Poly(3-hexylthiophene) (P3HT), NiO, or $MoO_3$.

The counter electrode layer serves as the electrical contact for circuit connection and is selected from the group comprising of Pt, Au, Ni, Cu, Ag, In, Ru, Pd, Rh, Ir, Os, conductive carbon, indium doped tin oxide, a conductive polymer, or a combination thereof.

The thickness of the perovskite-polymer composite film is of 10 nm-10 μm or 1 nm-1.0 μm, The polymer has a weight percentage of about 2-25% of the total weight of the perovskite and the polymer.

The polymer has a structural unit comprising a thiourea (—HN(C=S)NH—) fragment and a (—$R^1$—O—$R^2$—) fragment, wherein $R^1$ and $R^2$ are each independently a $C_1$-$C_6$ alkyl or a cycloalkyl linker. The structural unit can further comprises a (—O—Si(CH$_3$)$_2$—O—) fragment, or the polymer has a formula I:

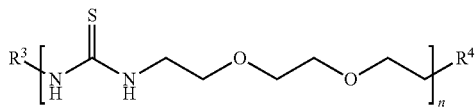

wherein $R^1$ and $R^2$ are —CH$_2$—CH$_2$—, $R^3$ and $R^4$ are each independently —NH$_2$ or

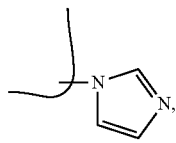

wherein —NH$_2$ and/or

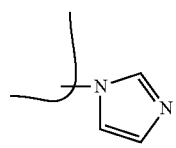

can be in protonated form, and n is 10-300.
and the perovskite has a formula of ABX$_3$, where A is Cs$^+$, CH$_3$NH$_3^+$ (MA), NH$_2$(CH)NH$_2^+$ (FA), or any combination thereof; B is Ge$^{2+}$, Sn$^{2+}$, Pb$^{2+}$, or any combination thereof; X is Cl$^-$, Br$^-$, I$^-$ or any combination thereof.

In another embodiment, provided is a method of making perovskite-polymer composite, wherein polymer has a structural unit comprising a thiourea (—HN(C=S)NH—) fragment and a (—$R^1$—O—$R^2$—) fragment, wherein $R^1$ and $R^2$ are each independently a $C_1$-$C_6$ alkyl or a cycloalkyl linker and perovskite has a formula of ABX$_3$, wherein A is Cs$^+$, CH$_3$NH$_3^+$ (MA), NH$_2$(CH)NH$_2^+$ (FA), or any combination thereof; B is Ge$^{2+}$, Sn$^{2+}$, Pb$^{2+}$, or any combination thereof; and X is Cl$^-$, Br$^-$, I$^-$ or any combination thereof, which method comprises spin coating a polymer-perovskite composite as a thin film in a single step.

In another embodiment, provided is a method of making solar cells, which method comprises:
(a) spin-coating either of a first hole transporting layer or a first electron transporting layer onto a substrate coated with a transparent conducting layer;
(b) treating the first hole transporting layer or the first electron transporting layer with ultraviolet, ozone, and dimethylformamide (DMF);
(c) spin-coating a perovskite-polymer layer onto the first hole transporting layer or the first electron transporting layer;
(d) annealing the perovskite-polymer layer;
(e) when a first hole transporting layer is spin-coated in (a), spin-coating a second electron transporting layer onto the perovskite-polymer layer, or when a first electron transporting layer is spin-coated in (a), spin-coating a second hole transporting layer onto the perovskite-polymer layer;
(f) spin-coating either of a hole blocking layer or an electron blocking layer onto the second electron transporting layer or the second hole transporting layer; and
(g) annealing a counter electrode layer onto the hole blocking layer or the electron blocking layer;
whereupon a solar cell is made.

The perovskite-polymer is spin coated with a precursor solution comprising (i) dimethylsulfoxide (DMSO) and (ii) perovskite with an ABX$_3$ crystal structure, wherein A is CH$_3$NH$_3^+$ (MA), NH$_2$(CH)NH$_2^+$ (FA), or Cs$^+$; B is Pb$^{2+}$ or Sn$^{2+}$; and X is Cl$^-$, Br$^-$, or I$^-$, and annealing in (d) is performed at a temperature between about 50° C. and about 100° C. for a time between about two minutes and about 360 minutes.

The substrate in step (a) acts as a mechanical support for the transporting layers. The substrate can be glass, polyethylene terephthalate (PET), polyethylene naphthalate (PEN), polyethylenimide (PEI), polyimide (PI), NOA63, or other polymer substrates.

The hole blocking layer in step (f) can be bathocuproine (BCP), polymethyl methacrylate (PMMA), or polyvinylpyrrolidone (PVP).

The electron blocking layer in step (f) can be aluminium oxide (AlOx), PMMA, PVP, Lithium fluoride (LiF), or 2D perovskite layers.

BRIEF DESCRIPTION OF THE DRAWINGS

FIG. 4A illustrates J-V curves for champion rigid PSCs. FIG. 4B shows representative EQE spectra and integrated current density of devices fabricated at the champion conditions. FIG. 4C shows thermal stability at 85° C. for rigid PSCs. FIG. 4D illustrates J-V curves of the champion flexible devices. FIG. 4E shows bending cycling at a 5 mm radius, with an inset image demonstrating bending. FIG. 4F shows bending steps at a 1.5 mm radius, 50 times, and healing steps at 85° C. for 30-minutes.

FIG. 7A illustrates before and after 100° C. heating for 3 hours XRD spectra of the TUEG3-containing films. The intensity ratio of the (001) PbI$_2$ peak (12.7 deg) to the (110) MAPbI$_3$ peak (14.1 deg) is 0.43, 0.15, and 0.02 for the 0%, 0.2%, and 2.1% TUEG3 films. FIG. 7B shows thermogravimetric analysis spectra comparing the TUEG3-containing powders to pure MAPbI$_3$. FIG. 7C shows differential scanning calorimetry scans of composite materials with different TUEG3 mass percentages. With the addition of TUEG3, the phase transition temperature of MAPbI$_3$ (tetragonal to cubic) is reduced. This indicates TUEG3 makes the MAPbI$_3$ crystal structure more fluidic and thermally stable, which are beneficial properties for self-healing.

DETAILED DESCRIPTION

Figure 1A:
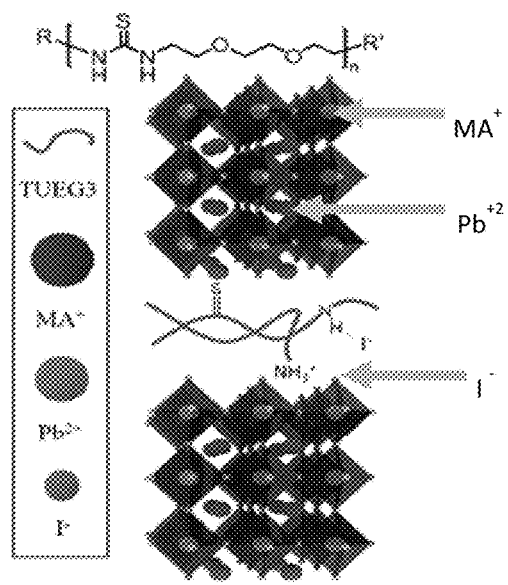
FIG. 1A illustrates the schematic of perovskite interactions with TUEG3, wherein MA+, Pb+ and I$^-$ represents perovskite groups. R and R' represent amine or imidazolium terminal groups.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

The term "about" can allow for a degree of variability in a value or range, for example, within 10%, within 5%, or within 1% of a stated value or of a stated limit of a range.

The term "substantially" can allow for a degree of variability in a value or range, for example, within 90%, within 95%, or within 99% of a stated value or of a stated limit of a range.

The term "perovskite" refers to the "perovskite structure" and not specifically to the perovskite material, CaTiO$_3$. "Perovskite" encompasses and preferably relates to any material that has the same type of crystal structure as calcium titanium oxide and of materials in which the bivalent cation is replaced by two separate monovalent cations. The perovskite structure has the general stoichiometry AMX$_3$, where "A" and "M" are cations and "X" is an anion. The "A" and "M" cations can have a variety of charges and in the original Perovskite mineral (CaTiO$_3$), the A cation is divalent and the M cation is tetravalent. For the purpose of this invention, the perovskite formulae include structures having three or four anions, which may be the same or different, and/or one or two organic cations, and/or metal atoms carrying two or three positive charges, in accordance with the formulae presented elsewhere in this specification.

Organic-inorganic halide perovskites have gained significant research interests in the past decade for their excellent optoelectronic properties and low-temperature solution processability. Processed from solutions at room temperature, polycrystalline perovskite solar cells (PSCs) have achieved power conversion efficiencies (PCEs) as high as 25.5%, which are comparable to the champion single-crystal silicon device. The defect tolerance and smaller sensitivity to grain boundaries of perovskites are benefits attributed to their soft crystal lattice. Perovskites feature an ABX$_3$ crystal structure where A=CH$_3$NH$_3^+$ (MA), NH$_2$(CH)NH$_2^+$ (FA), or Cs$^+$, B=Pb$^{2+}$, Sn$^{2+}$ and X=Cl$^-$, Br$^-$, or I$^-$. Hybrid perovskites feature a combination of X . . . H—N and X . . . H—C bonding in addition to tetrel-, pnictogen- and lump-hole bonding interactions. This soft lattice enables liquid-like behaviors such as dynamic screening, large polaron formation, and slow cooling of hot carriers, which all contribute to perovskites' remarkable properties.

The soft perovskite lattice with low formation energy and liquid-like lattice dynamics inspired us to investigate the possibility of mechanically self-healing perovskite material. To further promote the fluidic behavior of the halide perovskites, we sought to use a polymer-perovskite hybrid approach. Previous works have incorporated small amounts of a variety of commercial polymers to passivate defects at the perovskite grain boundaries and assist in the film crystallization process, which lead to improved device performances and stabilities. However, these polymers have relatively weak interactions with the halide perovskite crystal lattice and do not change the films macroscopic mechanical properties. In this work, a mechanically tough and self-healable thiourea-triethylene glycol polymer (TUEG3, FIG. 1A) with a glass transition temperature near room temperature and strong interactions with perovskites is synthesized and incorporated into perovskite thin films. The TUEG3 polymer in the active layer is found to facilitate the rejoining of distant perovskite grains and heal large cracks, while maintaining high mechanical strength and good electronic properties of the composite film. Solar cells fabricated using these self-healing composite films exhibit PCEs over 10%. Importantly, the thermal stability and mechanical flexibility of these materials and devices have been enhanced dramatically.

In one embodiment, provided is a perovskite-polymer composite comprising a perovskite and a polymer, wherein the polymer has a structural unit comprising a thiourea (—HN(C=S)NH—) fragment and a (—R$^1$—O—R$^2$—) fragment, wherein R$^1$ and R$^2$ are each independently a C$_1$-C$_6$ alkyl or a cycloalkyl linker. The structural unit further comprises a (—O—Si(CH$_3$)$_2$—O—) fragment to provide a more flexible structure.

In one embodiment of said perovskite-polymer composite, wherein R$^1$ and R$^2$ are —CH$_2$—CH$_2$—.

In one embodiment of said perovskite-polymer composite, wherein the polymer has a formula I:

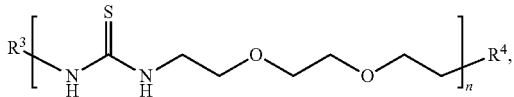

wherein R$^3$ and R$^4$ are each independently —NH$_2$ or

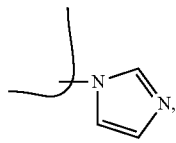

wherein —NH$_2$ and/or

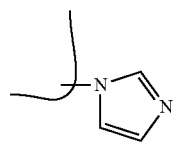

can be in protonated form, and n is 10-300.

In one embodiment of said perovskite-polymer composite, wherein the perovskite has a formula of ABX$_3$, where A is Cs$^+$, CH$_3$NH$_3^+$ (MA), NH$_2$(CH)NH$_2^+$ (FA), or any combination thereof; B is Ge$^{2+}$, Sn$^{2+}$, Pb$^{2+}$, or any combination thereof; X is Cl$^-$, Br$^-$, I$^-$ or any combination thereof.

In one embodiment, the polymer has a weight percentage of about 2-25% of the total weight of the perovskite and the polymer.

In one embodiment, the perovskite-polymer composite is a thin film with a thickness of 10 nm-10 μm, or 1 nm-1.0 μm.

In another embodiment, provided is a solar cell comprising a transparent conducting layer, a hole transporting layer, a perovskite layer, an electron transporting layer, and a counter electrode layer, wherein the perovskite layer comprises a thin film of the perovskite-polymer composite of the present disclosure.

In another embodiment, the transparent conducting layer serves as an electrical contact on the sides of the device stack which allows light to pass through and is selected from the group comprising of indium doped tin oxide (ITO), fluorine doped tin oxide (FTO), ZnO—Ga$_2$O$_3$, ZnO—Al$_2$O$_3$, tin oxide, antimony doped tin oxide (ATO), SrGeO$_3$, zinc oxide, or any combination thereof.

In another embodiment, the electron transporting layer facilitate the selective extraction of electrons out of the absorbing perovskite layer and is selected from the group comprising of [6,6]-phenyl-C$_{61}$-butyric acid methyl ester (PC$_{61}$BM), 1,4,5,8,9,11-hexaazatriphenylene-hexacarbonitrile (HAT-CN), (C$_{61}$-I$_h$)[5,6]fullerene (C60), (C70-D5h)[5,6]fullerene (C70), [6,6]-Phenyl C$_{71}$ butyric acid methyl ester (PC$_{71}$BM), 2,9-dimethyl-4,7-diphenyl-1,10-phenanthroline (BCP), 1,3,5-tri(phenyl-2-benzimi-dazolyl)-benzene (TPBI), polyethyleneimine ethoxylated (PEIE), poly [(9,9-bis(3'-(N,N-dimethylamino)propyl)-2,7-fluorene)-alt-2,7-(9,9-dioctylfluorene)] (PFN), or metal oxide, wherein the metal oxide is an oxide of a metal selected from a group of metal consisting of Ti, Sn, Cs, Fe, Zn, W, Nb, SrTi, Si, Ti, Al, Cr, Sn, Mg, Mn, Zr, Ni, or Cu.

In another embodiment, the hole transporting layer facilitate the selective extraction of holes from the absorbing perovskite layer and is selected from the group comprising of triphenylamine, carbazole, N,N,(diphenyl)-N',N'di-(alkylphenyl)-4,4'-biphenyldiamine (pTPDs), diphenylhydrazone, poly [N,N'-bis(4-butylphenyl)-N,N'-bis(phenyl)benzidine] (polyTPD), polyTPD substituted by electron donor groups and/or acceptor groups, poly(9,9-dioctylfluorene-alt-N-(4-butylphenyl)-diphenylamine) (TFB), 2,2',7,7'-tetrakis-N,N-di-p-methoxyphenylamine-9,9'-spirobifluorene) (spiro-OMeTAD), N,N,N',N'-tetraphenylbenzidine (TPD), poly[bis(4-phenyl)(2,4,6-trimethylphenyl)amine (PTAA), poly(3-hexylthiophene) (P3HT), NiO, or MoO$_3$.

In another embodiment, the counter electrode layer serves as an electrical contact for the device is selected from the group comprising of Pt, Au, Ni, Cu, Ag, In, Ru, Pd, Rh, Ir, Os, conductive carbon, indium doped tin oxide, conductive polymer, or a combination thereof.

In some embodiment, provided is the solar cell comprising the film of the perovskite-polymer composite with thickness of 10 nm-10 μm.

In some embodiment, provided is the solar cell comprising the film of the perovskite-polymer composite with thickness of 1 nm-1.0 μm.

In some embodiment, provided is the solar cell comprising the polymer which has a structural unit comprising a thiourea (—HN(C=S)NH—) fragment and a (—R$^1$—O—R$^2$—) fragment, wherein R$^1$ and R$^2$ are each independently a C$_1$-C$_6$ alkyl or a cycloalkyl linker. The structural unit can further comprises a (—O—Si(CH$_3$)$_2$—O—) fragment.

In some embodiment, provided is the solar cell comprising the polymer which has a formula I:

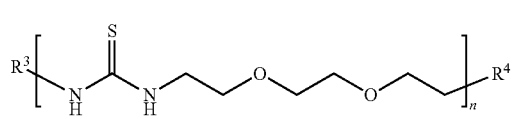

wherein R$^1$ and R$^2$ are —CH$_2$—CH$_2$—, R$^3$ and R$^4$ are each independently —NH$_2$ or

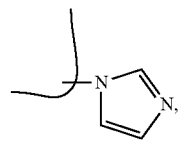

wherein —NH$_2$ and/or

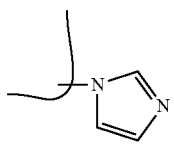

can be in protonated form, and n is 10-300.

In some embodiment, provided is the solar cell comprising the polymer which has a weight percentage of about 2-25% of the total weight of the perovskite and the polymer.

In some embodiment, provided is the solar cell comprising the perovskite which has a formula of $ABX_3$, where A is $Cs^+$, $CH_3NH_3^+$ (MA), $NH_2(CH)NH_2^+$ (FA), or any combination thereof; B is $Ge^{2+}$, $Sn^{2+}$, $Pb^{2+}$, or any combination thereof; X is $Cl^-$, $Br^-$, $I^-$ or any combination thereof.

The disclosure provides a method of making perovskite-polymer composite, wherein the polymer has a structural unit comprising a thiourea (—HN(C=S)NH—) fragment and a (—$R^1$—O—$R^2$—) fragment, wherein $R^1$ and $R^2$ are each independently a $C_1$-$C_6$ alkyl or a cycloalkyl linker and perovskite has a formula of $ABX_3$, wherein A is $Cs^+$, $CH_3NH_3^+$ (MA), $NH_2(CH)NH_2^+$ (FA), or any combination thereof; B is $Ge^{2+}$, $Sn^{2+}$, $Pb^{2+}$, or any combination thereof; and X is $Cl^-$, $Br^-$, $I^-$ or any combination thereof, which method comprises spin coating a polymer-perovskite composite as a thin film in a single step.

Provided is a method of making perovskite-polymer composite, wherein in polymer is TUEG3.

TUEG3 with a number-averaged molecular weight ranging from 15,000 g/mol to 36,000 g/mol were synthesized. The synthesis of TUEG3 was adopted from a recent literature report with slight modification (e.g., amine termination is used to enhance the interactions with perovskite). See Yanagisawa, Y., et. al., Science, 359, 72-76, (2018). Batches of TUEG3 were characterized using NMR spectroscopy. The transparent polymer features of thiourea and ether groups for hydrogen bonding and excess electron density for defect passivation are similar to reported small molecule additives. In addition to these interactions with perovskite components, the comparable structure to polyethylene glycol (PEG) also gives the potential to assist in healing moisture-degraded perovskite films.

Provided is method of fabricating TUEG3-perovskite composite thin film using one-step spin coating wherein different amounts of TUEG3 added directly to the perovskite precursor solution. With larger percentages of TUEG3, the solution became more viscous. Therefore, the solutions with higher polymer content were diluted and the reported mass percentage of polymer is defined as $m_{poly}/(m_{poly}+m_{PVSK})$, where $m_{poly}$ is the weight of polymer and $m_{PVSK}$ is the weight of perovskite (solvent mass is not included). During spin-coating the 6.0% and 16.6% TUEG3 perovskite solutions, the drying and crystallization of the wet films are considerably slower based on the color change during the spin coating and annealing processes. Usually, slow crystallization results in the asynchronous precipitation of methylammonium iodide (MAI) and lead iodide ($PbI_2$) and rough surface morphology; however, here the $MAPbI_3$ thin films fabricated with 6.0% and 16.6% polymer are smooth and phase pure (FIG. 5, 6, 7A). The slow crystallization is likely caused by the strong interactions between TUEG3 and the perovskite precursors.

The studies on perovskite-polymer interactions, thermal stability, optimal fabrication conditions, decomposition, healing, and mechanical properties of the TUEG3-perovskite composite thin film are as discussed below:

Polymer-Perovskite Interactions

Figure 1B:
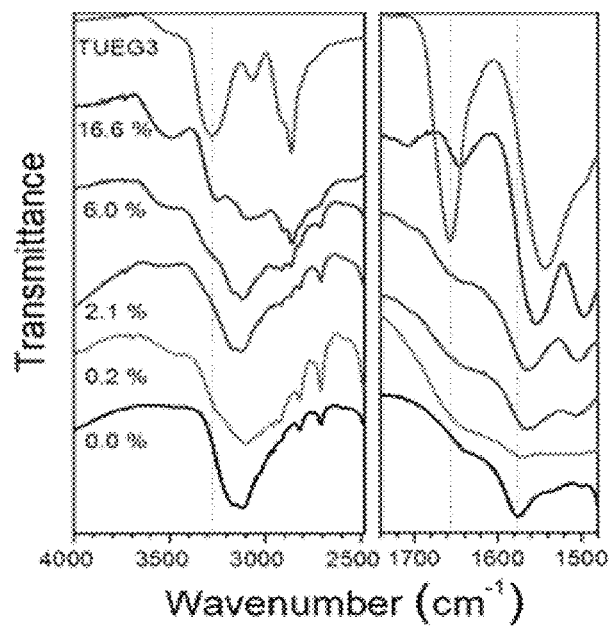
FIG. 1B shows FTIR spectra of composite films using different polymer mass ratios.

The perovskite-polymer interactions were probed using Fourier transform infrared spectroscopy (FTIR) and $^1$H nuclear magnetic resonance spectroscopy (NMR). Comparing the FTIR spectra of the perovskite film made using 16.6% TUEG3 to pure TUEG3, a red-shift (3275 cm$^{-1}$ to 3250 cm$^{-1}$) is seen in the stretching vibration of N—H ($v_{N—H}$) on the thiourea group in the presence of the $MAPbI_3$ (FIG. 1B). In addition, the C=S ($v_{C=S}$) shifts from 1657 cm$^{-1}$ to 1645 cm$^{-1}$. These suggest the formation of lower energy bonds compared to the interchain interactions of the polymer. We also observed the existence of a new peak at 3500 cm$^{-1}$ in the TUEG3-containing perovskite films. This absorption can be ascribed to the N—H stretching vibration of $MA^+$ weakly bonded to thiourea sulfur groups.

Figure 1C:
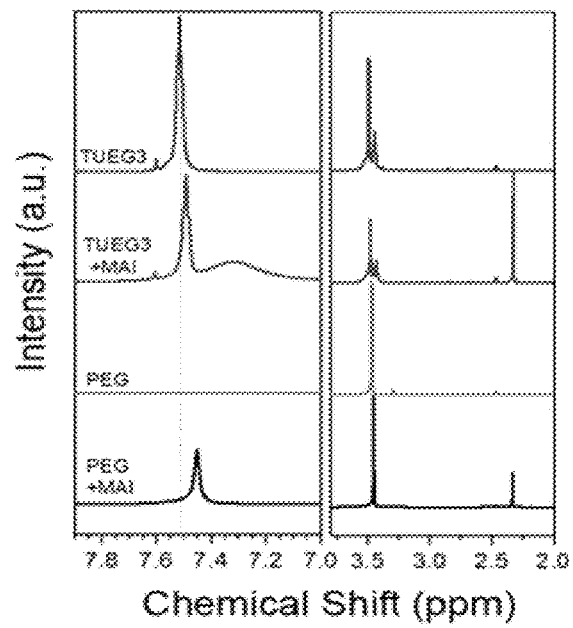
FIG. 1C illustrates $^1$H NMR spectra comparing TUEG3 and PEG interactions with MAI in d$^6$-DMSO.

NMR was used to further investigate the perovskite-polymer interactions. By comparing the NMR spectra of TUEG3 with MAI to pure TUEG3 (FIG. 1C), it is found that the hydrogens on the thiourea group are represented by the peak at 7.51 ppm, close to the 7.45 ppm peak of pure MAI. When MAI is present, the thiourea peak of TUEG3 shifts slightly upfield to 7.48 ppm and a new broad peak at 7.32 ppm appears. This interaction with MAI is not found in the PEG-MAI mixture, supporting that the interaction of $MA^+$ is with the thiourea groups. The integral of the broad peak and the methyl hydrogens peak of MAI at 2.33 ppm have a 1:1 ratio, confirming the broad peaks assignment to MAI. Meanwhile, $I^-$ ions bonding with the thiourea N—H groups cause the upfield shift in the NMR spectra and red-shift in the FTIR spectra. In addition, bound $I^-$ ions will leave free $MA^+$ ions to cause the C=S red-shift and new absorption at 3500 cm$^{-1}$ in the FTIR spectra.

It is important to understand these interactions to further hypothesize how TUEG3 may assist in stabilizing and healing perovskite grains, and also to avoid an imbalance of perovskite ions ($MA^+$, $Pb^{2+}$, $I^-$) which would lead to compositional point defects in the perovskite. Since the interactions with TUEG3 can slow down the formation of perovskite, the perovskite device fabrication was modified for each polymer mass percentage. By reducing the total solution concentration and increasing the annealing time, the perovskite ions are given more freedom and time to diffuse through the polymer and continue the perovskite crystallization.

Thin Film Thermal Properties

To investigate the thermal stability and identify the optimal fabrication conditions for each composite film, the hybrid thin films were annealed at 100° C. and examined using X-ray diffraction (XRD). After annealing, the composite films with more polymer showed a smaller ratio of the peak intensity of lead iodide to $MAPbI_3$ in the XRD spectra, indicating less degradation. Specifically, the intensity ratio of the (001) $PbI_2$ peak to the (110) $MAPbI_3$ is 0.43, 0.15, and 0.02 for the 0%, 0.2%, and 2.1% TUEG3 films, while the 6% and 16.6% films showed no degradation after more than 3 hours. The strong interactions between TUEG3 and $MAPbI_3$ slow the crystallization and likely inhibit the degradation of the perovskite to lead iodide and methylammonium iodide derivatives. These results suggest the higher polymer content films can be annealed in a wider time-window and this enables the use of thermal annealing as a healing stimulus.

To further characterize the new materials, thermogravimetric analysis (TGA) was used to study the decomposition of the composite films from 25° C. to 1000° C. The high temperature degradation of $MAPbI_3$ were well maintained after the introduction of TUEG3. Using differential scanning calorimetry (DSC), the phase transitions of the composite powders were measured. Increasing the polymer ratio leads to a decrease in the tetragonal to cubic perovskite phase transition temperature, which indicates the perovskite is more fluid-like and favors further grain growth and healing.

Thin Film Healing Properties

Figure 2A:
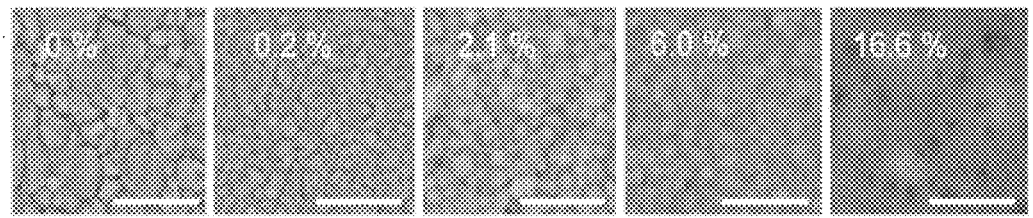
FIG. 2A shows SEM surface and FIG. 2B shows cross-sectional images of composite films fabricated with different polymer mass %. The scale bars are 500 nm.
Figure 2B:
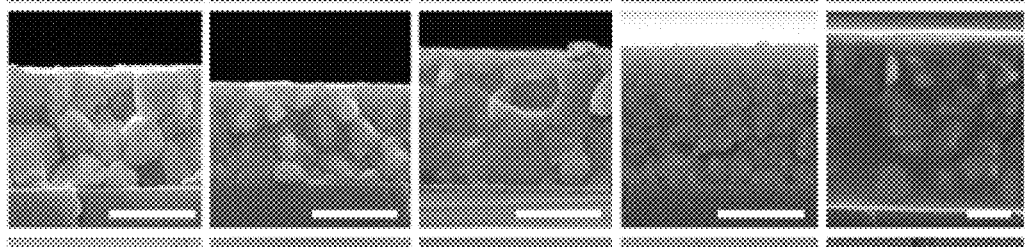
Figure 2C:
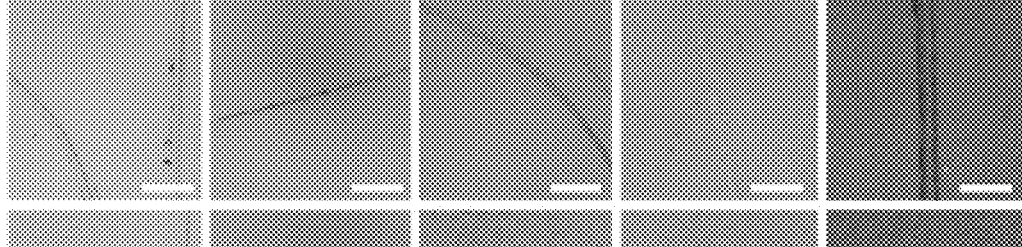
FIG. 2C and FIG. 2D illustrate the optical images before (FIG. 2C) and after (FIG. 2D) heating at 100° C. for 1 hour using different polymer mass %. The scale bars are 20 μm. The SEM and optical images in FIG. 2A through FIG. 2D from left to right correspond to perovskite-polymer composite thin films with the polymer mass % of 0, 0.2%, 2.1%, 6.0% and 16.6%, respectively.
Figure 2D:
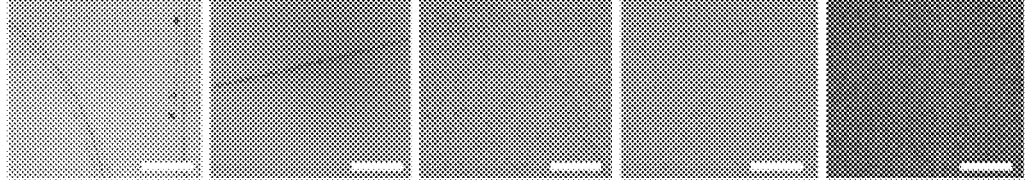
Figure 2E:
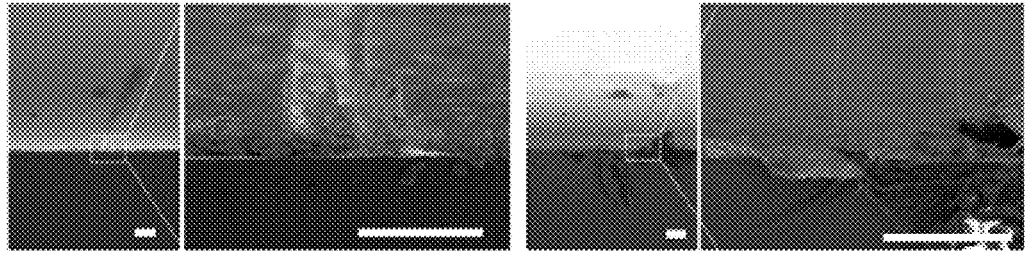
FIG. 2E shows cross-sectional SEM images of the 16.6% composite film before and after healing. The scale bars are 10 μm.

Scanning electron microscopy (SEM) images of the surfaces and cross-sections reveal the morphology of the composite films (FIG. 2A, FIG. 2B). The films are uniform and compact with no pinholes. For the higher polymer content films, the contrast in SEM images clearly distinguishes between the perovskite grains and polymer matrix. The healing behavior of perovskite-polymer composite films was investigated using a razor blade to scratch the surface and then annealing the films at 100° C. for 1 hour in nitrogen atmosphere. Optical images of a scratch on different polymer mass percentage films, before and after annealing, display the healing ability of the composite films (FIG. 2C, FIG. 2D). It was found that a film with a polymer concentration of 2.1% or higher can heal spontaneously within 1 hour at 100° C. The tilted cross-section SEM images of a 16.6% film before and after healing are shown in FIG. 2E. As revealed in the SEM images, the film morphology is very smooth after healing the 6 μm-wide scratch. Using atomic force microscopy (AFM) and photoluminescence images, we observed a similar healing behavior after annealing in multiple samples with a polymer concentration over 2.1%.

Thin Film Mechanical Properties

Figure 3A:
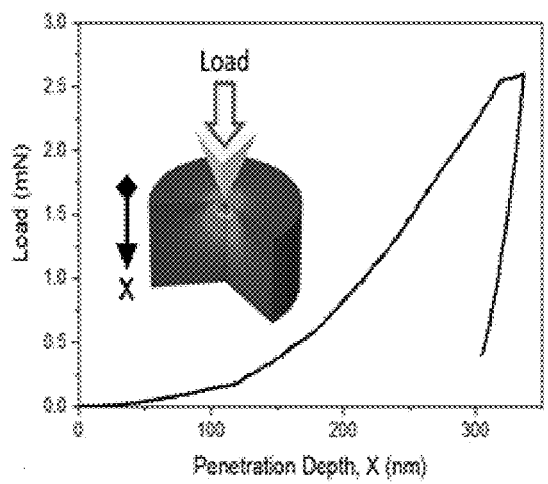
FIG. 3A illustrates Load vs. displacement of MAPbI$_3$ and schematic of the nanoindentation experiments.
Figure 3B:
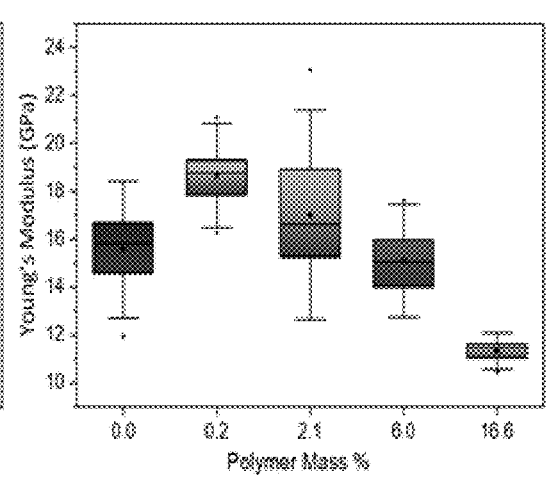
FIG. 3B illustrates Young's modulus for different composite films.
Figure 3C:
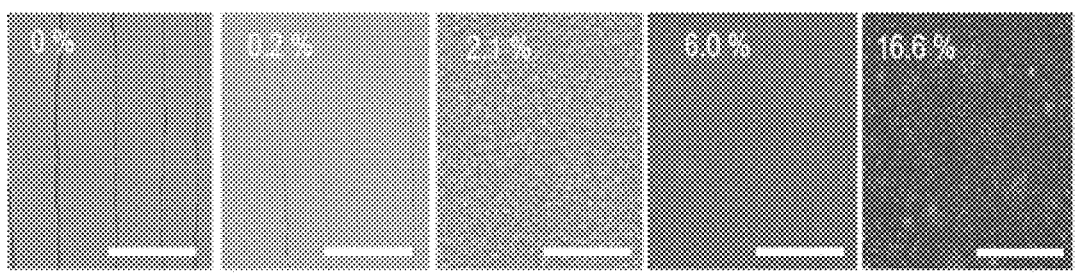
FIG. 3C illustrates SEM images of composite films on PET after bending around a 1 mm diameter cylinder. The white scale bars are 5 μm.
Figure 5A:
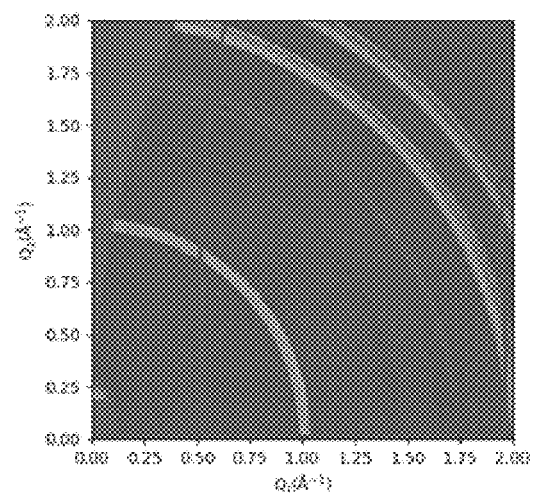
FIG. 5A depicts the GIWAXS data for MAPbI$_3$ film.
Figure 5B:
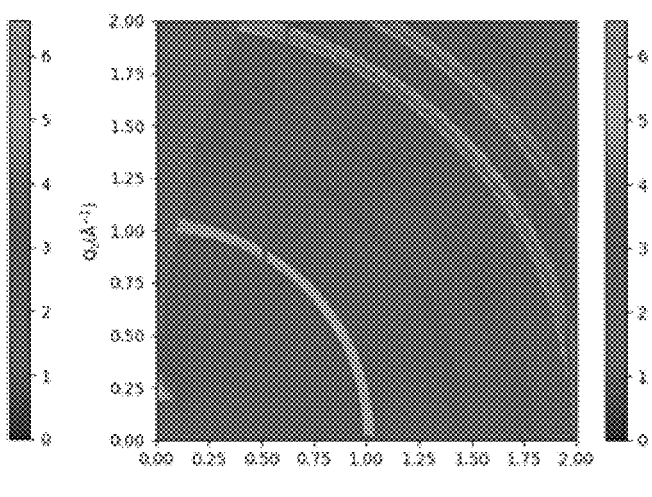
FIG. 5B depicts the GIWAXS data for TUEG3-0.2% film.
Figure 5C:
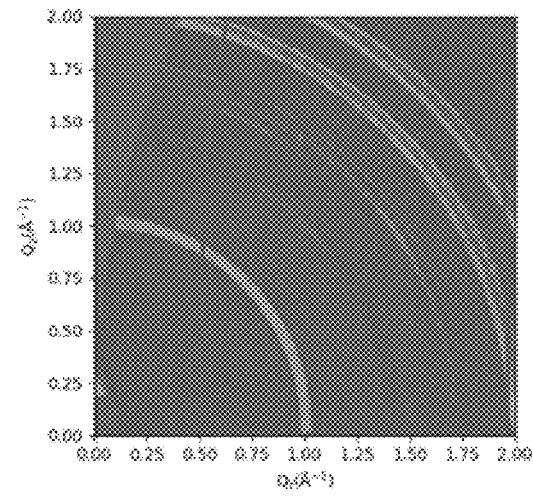
FIG. 5C depicts the GIWAXS data for TUEG3-2.1% film
Figure 5D:
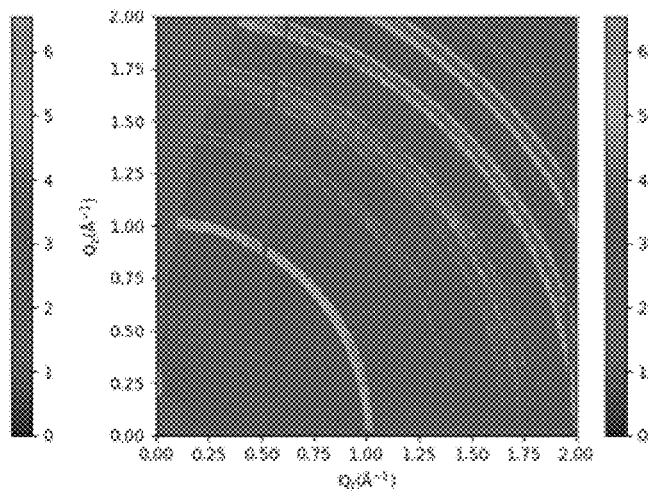
FIG. 5D depicts the GIWAXS data for TUEG3-6% film. These results display the high phase purity and crystallinity of the TUEG3-containing films.
Figure 6:
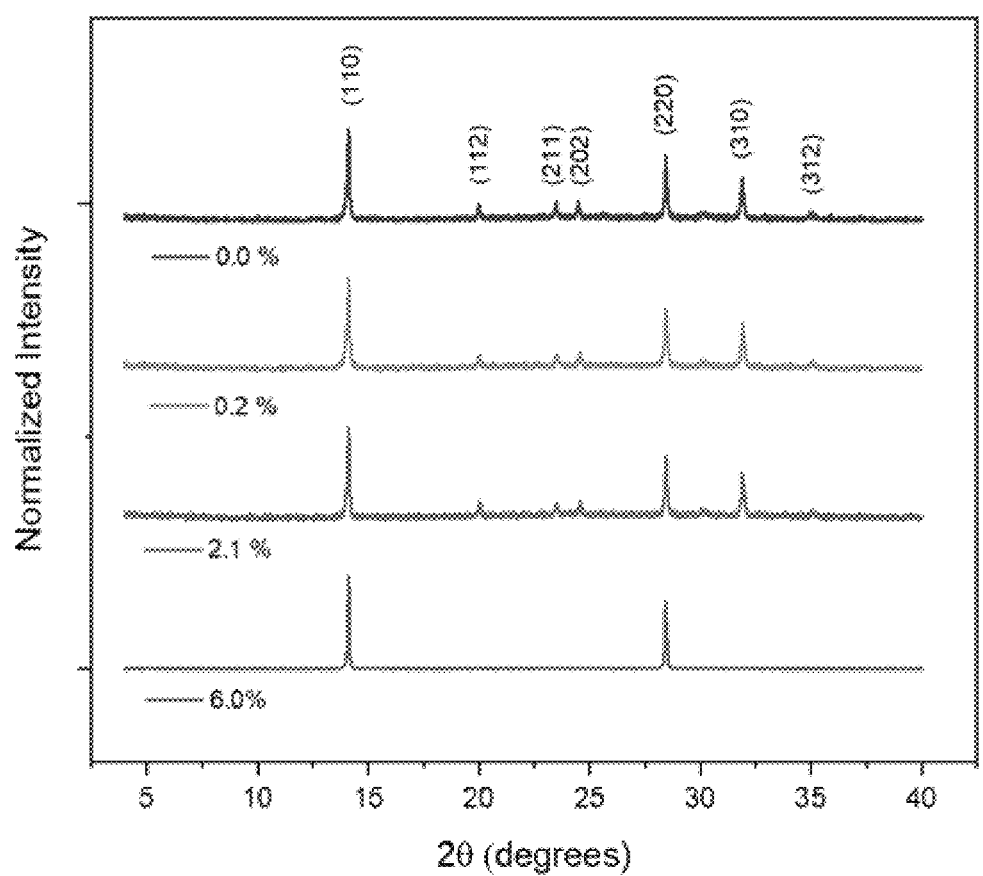
FIG. 6 shows XRD spectra of composite materials. XRD spectra of composite materials on glass/ITO/PTAA fabricated at champion device conditions for different mass percentages in the spin coating solution. The films were annealed at 2, 60, 60, and 360 minutes for the TUEG3-0%, TUEG3-0.2%, TUEG3-2.1%, and TUEG3-6.0% composites, respectively. The absence of the (001) PbI$_2$ peak at 12.7 deg after annealing the TUEG3-6.0% film for 360 minutes at 100° C. shows the thermal stability is enhanced. Enhanced thermal stability enables the temperature to be used as a self-healing stimulus.

The mechanical properties of the composite films were investigated using nanoindentation to obtain the Young's modulus and hardness of the films. The moduli were extracted from the slope of the initial unloading curve (FIG. 3A). The 0.2% film exhibited slightly larger average modulus of 18.8 GPa followed by the 2.1% and 0% films (FIG. 3B). The relatively larger Young's moduli of the 0.2% and 2.1% films suggest strong interactions between the organic and the inorganic moieties and reduced dislocation densities. At lower polymer mass percentages, the perovskite grain growth is less restricted while the small polymer chains act as nucleation sites, possibly leading to a higher perovskite macro packing density and modulus. This phenomenon is likely akin to the extraordinary mechanical strength observed in nacre and fiber-reinforced polymer composites. At high polymer mass percentages, the Young's modulus decreases. The 16.6% film exhibited the smallest average modulus of 11.3 GPa (FIG. 3B). The relatively smaller Young's moduli of the 16.6% and 6.0% films suggest a softening effect from the added polymer chains, which promote self-healing. Note, the 16.6% TUEG3 composite film had a much larger modulus than the reported value of 1.4 GPa for the pure TUEG3. To further showcase the composites mechanical properties, the solutions were spin-coated on polyethylene terephthalate (PET) substrates and bent around a 1 mm diameter cylinder to observe the density of fractures using SEM (FIG. 3C). The pure MAPbI$_3$ film contained approximately 90 cracks per 0.1 mm, while the 2.1% TUEG3 film contained about 40 cracks per 0.1 mm. The 6.0% and 16.6% films only displayed minor or no stress fractures. With encouragement from these results, flexible devices were fabricated with the mechanically durable composite materials.

In one embodiment, provided is a method of making perovskite-polymer solar cells comprising:

a) spin-coating either of a first hole transporting layer or a first electron transporting layer onto a substrate coated with a transparent conducting layer (b) treating the first hole transporting layer or the first electron transporting layer with ultraviolet, ozone, and dimethylformamide (DMF);

(c) spin-coating a perovskite-polymer layer onto the first hole transporting layer or the first electron transporting layer;

(d) annealing the perovskite-polymer layer;

(e) when a first hole transporting layer is spin-coated in (a), spin-coating a second electron transporting layer onto the perovskite-polymer layer, or when a first electron transporting layer is spin-coated in (a), spin-coating a second hole transporting layer onto the perovskite-polymer layer;

(f) spin-coating either of a hole blocking layer or an electron blocking layer onto the second electron transporting layer or the second hole transporting layer; and (g) annealing a counter electrode layer onto the hole blocking layer or the electron blocking layer;

whereupon a solar cell is made.

In another embodiment, the perovskite polymer is spin coated with a precursor solution comprising (i) dimethylsulfoxide (DMSO) and (ii) perovskite with an ABX$_3$ crystal structure, wherein A is $CH_3NH_3^+$ (MA), $NH_2(CH)NH_2^+$ (FA), or $Cs^+$; B is $Pb^{2+}$ or $Sn^{2+}$; and X is $Cl^-$, $Br^-$, or $I^-$.

The substrate in step (a) acts as a mechanical support for the said transporting layers. The substrate coated with transparent conductive oxide can have a total thickness ranging 1 micrometer to 10 mm and sheet resistance ranging from 5 ohm/sq to 500 ohm/sq. The substrate can be glass, polyethylene terephthalate (PET), polyethylene naphthalate (PEN), polyethylenimide (PEI), polyimide (PI), or other polymer substrates.

The hole blocking layer in step (f) can be bathocuproine (BCP), polymethyl methacrylate (PMMA), or polyvinylpyrrolidone (PVP).

The Electron blocking layer in step (f) can be aluminium oxide (AlOx), PMMA, PVP, Lithium fluoride (LiF), or 2D perovskite layers.

In another embodiment, annealing in (d) is performed at a temperature between about 50° C. and about 100° C. for a time between about two minutes and about 360 minutes.

Provided is method of making perovskite-polymer solar cells wherein polymer is TUEG3, hole transporting layer is poly(triaryl amine) PTAA, transparent conducting layer is ITO, electron transporting layer is $PC_{61}BM$, hole blocking layer is hole is BCP and counter electrode layer is Ag.

Those skilled in the art will recognize that numerous modifications can be made to the specific implementations described above. The implementations should not be limited to the particular limitations described. Other implementations may be possible.

Experimental Procedures

Chemicals and Reagents

The chemicals including 1,2-bis(2-aminoethoxy)ethane, diethyl ether (DE), methanol (MeOH), chlorobenzene (CB), dimethylformamide (DMF), dimethyl sulfoxide (DMSO) and lead iodide (PbI$_2$) were purchased from Sigma Aldrich. Methylammonium iodide (MAI) was purchased from Greatcell Solar Ltd. 1,1-Thiocarbonyldiimidazole was purchased from Oakwood Chemical. Poly(Triarylamine), Mw ~20 K, (PTAA-3Me), bathocuproine (BCP), and [6,6]-Phenyl-C61-butyric acid methyl ester ($PC_{61}BM$) were purchased from 1-Material Inc. PEDOT:PSS PH1000 was purchased from Ossila. All chemicals were used as received.

TUEG3 Polymer Syntheses

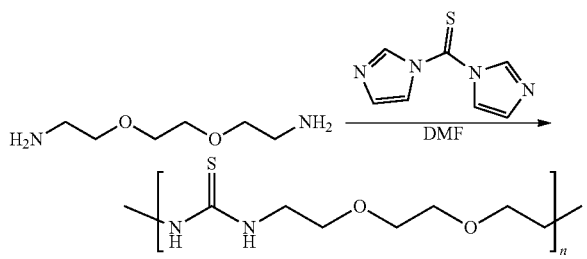

TUEG3 with a number-averaged molecular weight ranging from 15,000 g/mol to 36,000 g/mol were synthesized. The 15,000 g/mol and 24,000 g/mol $M_n$ polymers were formed by using a non-stoichiometric amount of monomers, where the diamine was in excess to terminate the polymer with amine groups and kept the $M_n$ near that of the reported self-healing polymer. For the middle $M_n$, excess diamine was added after the reaction to further ensure the polymer was amine terminated. Amine terminal groups are expected to have stronger interactions with the perovskite lattice and ionized components. The highest $M_n$ polymer is formed using a near 1:1 monomer ratio and thus may not be fully amine terminated.

Polymer Reaction (15,000 g/mol): 1,1'-thiocarbonyldiimidazole (6.970 g, 90% purity, 0.035 mol) and 1,2-bis(2-aminoethoxy)ethane (6 mL, 98% purity, 0.040 mol) were added to 21 mL of dimethyl formamide (DMF) at 70° C. for 24 hours under argon atmosphere.

Polymer Reaction (24,000 g/mol): 1,1'-thiocarbonyldiimidazole (6.970 g, 0.035 mol) and 1,2-bis(2-aminoethoxy)ethane (6 mL, 0.040 mol) were added to 21 mL of dimethyl formamide (DMF) at 40° C. for 10 hours under argon atmosphere. After, an excess amount (2 mL) of 1,2-bis(2-aminoethoxy)ethane was added at room temperature and stirred for 4 hours.

Polymer Reaction (36,000 g/mol): 1,1'-thiocarbonyldiimidazole (8.139 g, 0.041 mol) and 1,2-bis(2-aminoethoxy)ethane (6 mL, 0.040 mol) were added to 21 mL of dimethyl formamide (DMF) at 80° C. for 10 hours under argon atmosphere.

Purification: The solution was then poured into 1.2 L of diethyl ether and mixed. The ether layer was then separated from the precipitated polymer (oil-like brown tinted solid) and the polymer was dissolved in a minimum amount of chloroform. The concentrated chloroform solution was then poured into 1.8 L of methanol and the insoluble fraction was collected with a centrifuge at 5000 RPM for 5 mins. The methanol purification step was repeated, then the polymer was dried using a rotary evaporator (100 mbar) and then an oil pump (200 rotor). Before NMR, a small amount of the TUEG3 stock solution (in DMF) used for devices was dried in a vacuum oven at 130° C. for more than 12 hours. Even after 48 hours, DMF still appeared in the NMR spectra. $^1$H NMR (500 MHz, DMSO-$d_6$): δ 2.80 (br, $CH_2NH_2$), 3.42-3.59 (br, $CH_2O$, C(S)NH$CH_2$), 7.50 (br, C(S)NH). The $M_n$ was based on the intensity ratio between the signals at δ 2.85 (2H br, $CH_2NH_2$) and 7.50 ppm (thiourea-H).

Solar Cell Fabrication 13.6 mm×15.6 mm glass/ITO (~30 ohm/sq) and PET/ITO (150 μm thick, ~150 ohm/sq) substrates were sequentially washed with soap/water mixture, acetone, isopropanol, acetone, and isopropanol using an ultrasonic bath. After, the substrates were UV-Ozone treated for 30 minutes before spin-coating the PTAA layer. A 10 mg/mL solution of PTAA in toluene was used to statically spin coat a thin PTAA layer at 6000 RPM. For the flexible solar cells, a vacuum-less spin coater was used to avoid bending the substrates only during the 10 nm PTAA coating. The perovskite precursor solutions contained a 1:1:1 $PbI_2$:MAI:DMSO mole ratio to make a 1.5 M solution in dimethyl formamide (DMF). Only for the 6.0% TUEG3 solution was the perovskite concentration reduced to 1.15 M to decrease the solution viscosity. The polymer was added to the solution by first creating 60 mg/mL and 329 mg/mL stock solutions of TUEG3 in DMF. The appropriate volume of 60 mg/mL TUEG3 solution was used to create the TUEG3-0.2% and TUEG3-2.1% solutions. The 329 mg/mL TUEG3 solution was used to create the TUEG3-6.0% solution. Immediately before spin coating the perovskite layer, the PTAA layer was UV-ozone treated for 5 minutes then returned to the glovebox and wet with 60 μL of DMF. The DMF on PTAA layer was spun for 15 s before coating the perovskite layer. Without these steps, the perovskite solutions would not coat the hydrophobic PTAA layer. The perovskite layer was spin coated at 4000 RPM, 4000 RPM, 7000 RPM, and 10000 RPM for the 0, 0.2, 2.1, and 6.0% solutions respectively, using chlorobenzene (CB) as the antisolvent. The perovskite film was then annealed at 50° C. for 1 minute, 80° C. for 1 minute and 100° C. for 2, 60, 60, and 360 minutes for the 0, 0.2, 2.1, and 6.0% films, respectively. By using a three-step annealing process, dots on the surface of the pure $MAPbI_3$ films were eliminated and the device performance was improved. Next, a 20 mg/mL $PC_{61}BM$ solution in chlorobenzene was dynamically spin coated at 1500 RPM and annealed at 80° C. for 1 minute to residual CB. After, a 0.5 mg/mL bathocuproine (BCP) in isopropanol solution was dynamically spin coated at 2000 RPM. To expose the ITO on PET substrates, a portion of the film was carefully wiped away using a cotton swab with DMSO solvent then IPA antisolvent. For the glass/ITO substrates, the ITO was exposed using a razor blade to remove the coated layers. Finally, 90 nm of silver (Ag) was evaporated onto the devices using a three-step process. For the first 10 nm, an evaporation rate of 0.05 Å/s was used to avoid having Ag penetrate the film surface. The next 15 nm were evaporated at 0.15 Å/s. Finally, a rate of 0.35 Å/s was used to evaporate the remaining 65 nm. The devices were left in vacuum overnight (~15 hours) before measurement. For the solar cells used in the healing study, PH1000 was spin coated on the PET/ITO substrates at 3000 RPM and annealed at 120° C. for 15 minutes in air. After taping the bottom electrode and defining the device area by solvent wiping, the films were then annealed in the glovebox for 15 minutes before continuing the device fabrication as above.

Solar Cell Measurements

J-V characteristics of the solar cells were obtained in nitrogen at room temperature using a Keithley 2450 multimeter and an Enlitech SS-F5-3A solar simulator with 300 W Xenon lamp under a simulated AM1.5G spectrum. The light intensity was calibrated using a Si solar cell (calibrated and certified by Enlitech). The devices were measured from 1.2 V to −0.2 V then back to 1.2 V using a step size of 0.008 V and 2 ms dwell time. The device area was determined by the evaporation mask used to pattern silver as the top electrode. This was measured to be 0.110 $cm^2$ using an optical microscope with calibrated image. External quantum efficiency (EQE) measurements were performed at zero bias on equipment built in-house using a preamplifier and a lock-in amplifier at a chopper frequency of 161 Hz. The measurements were calibrated with a reference UV-enhanced Si (818-UV-L)diode. The wavelength of the illuminating beam was changed from 300 nm to 900 nm in 10 nm increments. EQE measurements were conducted in air at room temperature. The samples used for EQE measurements were aged in the glovebox for different lengths of time before EQE measurement. The integrated current density was calculated using NREL's ASTM G173-03 AM1.5G solar spectrum.

Bending and Healing Solar Cells

The devices were manually bent in air around cylindrical objects with a radius equal to the bending radius labeled in the plots. The devices were all bent along an axis perpendicular to the longer length of the silver electrodes, 90° rotated compared to the image in FIG. 4E. For the healing study shown in FIG. 4F, the devices were bent at a 1.5 mm radius 50 times for each bend step. The devices were placed on the hot plate at 85° C. for 30 minutes for each heal step.

Composite Film Fabrication

The thin film fabrication conditions used for the samples in the film healing, nanoindentation, DSC, FTIR, film bending tests, GIWAXS, and XRD in FIG. 7 were different than the optimized device fabrication conditions. The films for nanoindentation required a larger thickness to reduce the error in measurements from the substrate. In addition, a thicker film made it easier to scratch only the surface of the films used for the healing studies. Different from the optimized device conditions, the TUEG3-0%, TUEG3-0.2%, TUEG3-2.1%, TUEG3-6.0%, and TUEG3-16.6% were spin coated at 3000, 3000, 3000, 6000, and 9000 RPM and annealed for 2, 2, 2, 10, and 10 minutes, which correspond to film thicknesses of 671, 663, 805, 751, 2069 nm, respectively. In addition, the 24,000 g/mol TUEG3 was used in the above-mentioned studies.

Film Healing Tests

The composite films were lightly scratched with a clean razor blade by hand and imaged in air. Heating at 100° C. was done in a glovebox filled with nitrogen. The cut depth and width impacts whether the film can heal or not within the 1-hour time frame at 100° C., since scratching removes material needed to heal. The cross-sectional SEM images in FIG. 1E imaged the same spot before and after heating. The same spot was located, by comparing artifacts on the surface of the film and face of the cross-section.

Film Bending Tests

To qualitatively see the fracturing of the composite films, composite solutions were spin coated on 150 μm thick PET substrates (without ITO) and manually bent around a 1 mm diameter in air.

Characterizations

Atomic Force Microscopy

AFM images were recorded in tapping mode using a Bruker MultiMode 8 atomic force microscope in air.

Differential Scanning Calorimetry

A TA-Q2000 DSC instrument was used at a scan rate of 10° C. per minute in nitrogen to obtain the DSC curves.

Fourier Transform Infrared Spectroscopy

A Thermo Nicolet Nexus 470 spectrometer with a total attenuated reflection module (ATR) was used to obtain spectra from 4000 to 800 $cm^{-1}$ with a resolution of 4 $cm^{-1}$ and measuring 36 scans per sample. The samples were prepared by spin coating and annealing the films, then scrapping the films off glass substrates to create a powder sample.

Grazing Incidence Wide Angle X-Ray Scattering (GIWAXS)

GIWAXS measurement was performed at beamline 7.3.3 at the Advanced Light Source in the Lawrence Berkeley National Laboratory, with 10 keV X-rays (energy bandwidth ΔE/E 1%, beam size 300×700 micron). The scattering patterns were collected at multiple incident angles on a 2D detector (Pilatus 2M, Dectris), and representative ones are included. The sample-detector distance and beam center were calibrated using a silver behenate sample, and the 2D detector images were converted to the q space using the software Xi-CAM.

Nanoindentation Measurements

Nanoindentation experiments were performed using a KLA G200 Nano-indenter in an argon filled glovebox. Continuous stiffness measurement was implemented in thin films (>1 μm). Substrate effect is eliminated by embedded thin film method. Modulus and hardness were obtained as the average value for tip penetration greater than 150 nm.

Nuclear Magnetic Resonance Spectroscopy

NMR $^1H$ spectra were recorded on a Bruker Avance DRX-500 NMR spectrometer using a 5 mm BBFO probe at room temperature. The TUEG3 samples were dried in a vacuum oven at 130° C. for more than 12 hours before dissolving in d6-DMSO.

Optical Microscope and Photoluminescence Images

Images were captured in air using an Olympus microscope coupled with a light source (012-63000; X-CITE 120 REPL LAMP).

Profilometer Measurements

Film thicknesses were measured using a Bruker Dektak XT stylus profilometer in air.

Scanning Electron Microscopy

SEM images were taken using a FEI Teneo VS SEM at 5 kV and 0.10 nA using a back-scattered electron detector. Cross-sections of the devices were created by manually scoring a line on the back of the glass substrates then breaking along the line by hand.

Thermogravimetric Analysis

TGA was performed on TA Instruments Q50 TGA Thermogravimetric Analyzer in nitrogen. The samples were prepared by spin-coating and annealing the films, then scrapping the films off glass substrates to create a powder sample.

Time-Resolved and Steady-State Photoluminescence

A home-built microscope was used for the PL spectroscopy and time-resolved PL measurements. A picosecond pulse laser with wavelength of 447 nm was used as the excitation light and an objective (40×, NA=0.6, Nikon) was employed to focus the excitation light on the sample and collect the PL emission in wide-filed mode. The spectra were detected by a spectrometer (Andor Shamrock 303i) and CCD (Andor Newton 920). For the PL decay dynamics, the collected light was guided to a single photon avalanche diode (PicoQuant, PDM series) with a single photon counting module (PicoQuant). In order to exclude diffusion from the PL decays, the home-built setup is not a strict confocal such that emission beyond the excitation spot is also collected. The laser fluence was kept ~1 uJ/$cm^2$ for all samples to allow comparison under the same condition.

X-Ray Diffraction Spectroscopy

The $MAPbI_3$ perovskite crystal structure was confirmed in the composite materials using a Rigaku SmartLab X-ray Diffractometer with a Cu Kα source (λ=1.54056 Å) in air.

TABLE 1

Rigid and Flexible Solar Cell Device Parameters

| TUEG3 (Mass %) | $J_{SC}$ (mA/cm$^2$) | $V_{OC}$ (V) | FF (%) | PCE$_{max}$ (%) | PCE$_{avg}$ (%) |
|---|---|---|---|---|---|
| Rigid devices | | | | | |
| 0 | 20.47 | 1.08 | 74.3 | 16.26 | 14.82 ± 0.83 |
| 0.2 | 20.61 | 1.10 | 76.7 | 17.42 | 16.21 ± 0.75 |
| 2.1 | 19.00 | 1.14 | 50.1 | 10.82 | 8.63 ± 1.15 |
| 6.0 | 10.87 | 1.10 | 63.7 | 7.58 | 6.50 ± 0.77 |
| Flexible devices | | | | | |
| 0 | 21.49 | 1.04 | 61.4 | 13.69 | 11.35 ± 1.34 |
| 0.2 | 20.04 | 0.99 | 69.0 | 13.64 | 11.20 ± 0.94 |
| 2.1 | 12.49 | 1.01 | 53.5 | 6.79 | 5.00 ± 0.83 |
| 6.0 | 14.61 | 1.07 | 56.6 | 8.87 | 6.46 ± 0.87 |

Finally, the healing ability of the devices was investigated by bending flexible perovskite solar cells to near complete degradation and then annealing the devices on a hotplate. The device structure was modified to avoid the limitation of the ITO electrode by adding a layer of conductive PEDOT:PSS on ITO. The TUEG3-6.0% device could then be bent to a 1.5 mm radius 10 times with less than 5% degradation of its initial PCE, while the pure perovskite device with the same modification lost 50% of its initial PCE. After 50 bending cycles at a 1.5 mm radius, both devices degraded significantly. However, after annealing the films at 85° C. the TUEG3-6.0% device recovered to 80% of its initial PCE while the pure device showed little healing (FIG. 4F). The healing ability was less effective in the second cycle likely due to damage of the ITO electrode and charge transporting layers. Further optimizations on these layers are needed for better performance.

This work demonstrates a mechanically healable perovskite thin film via hybridizing an amorphous self-healing polymer with perovskite using secondary-bonding interactions, which were characterized using a series of spectroscopy methods. The favorable interactions lead to increased Young's modulus at low polymer content and softened lattice at high polymer content. These result in a self-healable and mechanically flexible material without scarifying its mechanical strength. Using the TUEG3-MAPbI3 hybrid composite as the active layer, solar cells with high efficiency and excellent mechanical and thermal stability were achieved. Even higher performance can be envisioned with new polymer design and device engineering. The results foreshadow the use of polymer-perovskite hybrid materials for smart, ultra-flexible and wearable devices.

We claim:

1. A method of making solar cells, which method comprises:
   (a) spin-coating either of a first hole transporting layer or a first electron transporting layer onto a substrate coated with a transparent conducting layer;
   (b) treating the first hole transporting layer or the first electron transporting layer with ultraviolet light, ozone, and dimethylformamide (DMF);
   (c) preparing a perovskite-polymer composite film by incorporating a self-healing polymer into a perovskite, wherein the self-healing polymer has a formula I:

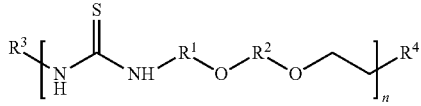

alone or in a further combination with a (—O—Si(CH$_3$)$_2$—O—) fragment, wherein R$^1$ and R$^2$ are each independently a C$_1$-C$_6$ alkyl and R$^3$ and R$^4$ are each independently —NH$_2$ or

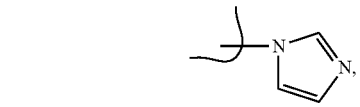

wherein —NH$_2$ and/or

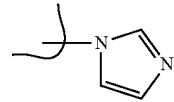

can be in protonated form, and n is 10-300;
   (d) spin-coating the perovskite-polymer composite film onto the first hole transporting layer or the first electron transporting layer;
   (e) annealing the perovskite-polymer composite film;
   (f) when a first hole transporting layer is spin-coated in (a), spin-coating a second electron transporting layer onto the perovskite-polymer composite film, or when a first electron transporting layer is spin-coated in (a), spin-coating a second hole transporting layer onto the perovskite-polymer composite film;
   (g) spin-coating either of a hole blocking layer or an electron blocking layer onto the second electron transporting layer or the second hole transporting layer; and
   (h) annealing a counter electrode layer onto the hole blocking layer or the electron blocking layer;
   whereupon a solar cell is made.

2. The method of claim 1, wherein the perovskite-polymer composite film is spin-coated with a precursor solution comprising (i) dimethylsulfoxide (DMSO) and (ii) a perovskite with an ABX$_3$ crystal structure, wherein A is CH$_3$NH$_3^+$ (MA), NH$_2$(CH)NH$_2^+$ (FA), or Cs$^+$; B is Pb$^{2+}$ or Sn$^{2+}$; and X is Cl$^-$, Br$^-$, or I or any combination thereof.

3. The method of claim 1, wherein annealing in (e) is performed at a temperature between about 50° C. and about 100° C. for a time between about two minutes and about 360 minutes.

4. The method of claim 1, wherein the substrate in step (a) is selected from the group consisting of glass, polyethylene terephthalate (PET), polyethylene naphthalate (PEN), polyethylenimide (PEI), polyimide (PI), and NOA63.

5. The method of claim 1, wherein the transparent conducting layer is selected from the group consisting of indium doped tin oxide (ITO), fluorine doped tin oxide (FTO), ZnO—Ga$_2$O$_3$, ZnO—Al$_2$O$_3$, tin oxide, antimony doped tin oxide (ATO), SrGeO$_3$, zinc oxide, and any combination thereof.

6. The method of claim 1, wherein the hole transporting layer is selected from the group consisting of triphenylamine, carbazole, N,N,(diphenyl)-N',N'di-(alkylphenyl)-4,4'-biphenyldiamine, (pTPDs), diphenylhydrazone, poly [N,N'-bis(4-butylphenyl)-N,N'-bis(phenyl)benzidine] (polyTPD), polyTPD substituted by electron donor groups and/or acceptor groups, poly(9,9-dioctylfluorene-alt-N-(4-butylphenyl)-diphenylamine (TFB), 2,2',7,7'-tetrakis-N,N-di-p-methoxyphenylamine-9,9'-spirobifluorene) (spiro-OMeTAD), N,N,N',N'-tetraphenylbenzidine (TPD), poly[bis(4-phenyl)(2,4,6-trimethylphenyl)amine (PTAA), poly(3-hexylthiophene) (P3HT), NiO, and MOO$_3$.

7. The method of claim 1, wherein the electron transporting layer is selected from the group consisting of [6,6]-phenyl-C$_{61}$-butyric acid methyl ester (P$_{61}$CBM), 1,4,5,8,9,11-hexaazatriphenylene-hexacarbonitrile (HAT-CN), (C$_{60}$-I$_h$)[5,6]fullerene (C$_{60}$), (C$_{70}$-D5h)[5,6]fullerene (C$_{70}$), [6,6]-Phenyl C$_{71}$ butyric acid methyl ester (PC$_{71}$BM), 2,9-dimethyl-4,7-diphenyl-1,10-phenanthroline (BCP), 1,3,5-tri(phenyl-2-benzimi-dazolyl)-benzene (TPBI), polyethyleneimine ethoxylated (PEIE), poly [(9,9-bis(3'-(N,N-dimethylamino) propyl)-2,7-fluorene)-alt-2,7-(9,9-dioctylfluorene)] (PFN), and a metal oxide, wherein the metal oxide is an oxide of a metal selected from the group consisting of Ti, Sn, Cs, Fe, Zn, W, Nb, SrTi, Si, Ti, Al, Cr, Sn, Mg, Mn, Zr, Ni, and Cu.

8. The method of claim 1, wherein the counter electrode layer is selected from the group consisting of Pt, Au, Ni, Cu, Ag, In, Ru, Pd, Rh, Ir, Os, conductive carbon, indium doped tin oxide, a conductive polymer, and a combination thereof.

9. The method of claim 1, wherein the hole blocking layer in step (g) is selected from the group consisting of bathocuproine (BCP), polymethyl methacrylate (PMMA), and polyvinylpyrrolidone (PVP).

10. The method of claim 1, wherein the electron blocking layer in step (g) is selected from the group consisting of aluminium oxide (AlOx), PMMA, PVP, lithium fluoride (LiF), and two-dimensional perovskite layers.

11. A method of making a perovskite-polymer composite, wherein the polymer has a formula I:

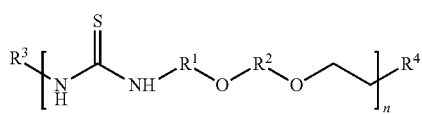

alone or in a further combination with a (—O—Si(CH$_3$)$_2$—O—) fragment, wherein R$^1$ and R$^2$ are each independently a C$_1$-C$_6$ alkyl and R$^3$ and R$^4$ are each independently —NH$_2$ or

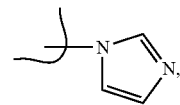

wherein —NH$_2$ and/or

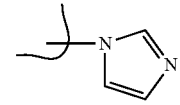

can be in protonated form, and n is 10-300, which method comprises spin coating a polymer-perovskite composite as a thin film in a single step.

12. The method of claim 11, wherein the perovskite has a formula of ABX$_3$, wherein A is Cs$^+$, CH$_3$NH$_3^+$ (MA), NH$_2$(CH)NH$_2^+$ (FA), or any combination thereof; B is Ge$^{2+}$, Sn$^{2+}$, Pb$^{2+}$, or any combination thereof; and X is Cl$^-$, Br$^-$, I$^-$ or any combination thereof.

* * * * *